(12) United States Patent
Ichitsubo et al.

(10) Patent No.: US 7,741,710 B2
(45) Date of Patent: Jun. 22, 2010

(54) MODULE WITH MULTIPLE POWER AMPLIFIERS AND POWER SENSORS

(75) Inventors: Ikuroh Ichitsubo, Kanagawa (JP);
Guan-Wu Wang, Palo Alto, CA (US);
Weiping Wang, Palo Alto, CA (US)

(73) Assignee: Micro Mobio Corporation, Palo Alto, CA (US)

( * ) Notice: Subject to any disclaimer, the term of this patent is extended or adjusted under 35 U.S.C. 154(b) by 1268 days.

(21) Appl. No.: 11/173,739

(22) Filed: Jul. 2, 2005

(65) Prior Publication Data

US 2005/0266617 A1    Dec. 1, 2005

Related U.S. Application Data

(63) Continuation of application No. 10/804,737, filed on Mar. 18, 2004, now abandoned.

(51) Int. Cl.
*H01L 23/24* (2006.01)

(52) U.S. Cl. .................. 257/724; 257/686; 257/723; 330/129; 330/144

(58) Field of Classification Search ................ 257/686, 257/723, 724; 330/129, 144
See application file for complete search history.

(56) References Cited

U.S. PATENT DOCUMENTS

| | | | |
|---|---|---|---|
| 4,977,041 A | 12/1990 | Shiozawa et al. | |
| 5,023,703 A * | 6/1991 | Hidaka et al. | 257/709 |
| 5,050,238 A | 9/1991 | Tomizuka et al. | |
| 5,164,683 A | 11/1992 | Shields | |
| 5,255,324 A | 10/1993 | Brewer et al. | |
| 5,283,539 A | 2/1994 | Sadhir et al. | |
| 5,548,239 A | 8/1996 | Kohama | |
| 5,564,092 A * | 10/1996 | Grandfield et al. | 455/232.1 |
| 5,608,364 A | 3/1997 | Hirai et al. | |
| 5,625,894 A | 4/1997 | Jou | |
| 5,656,972 A | 8/1997 | Norimatsu | |
| 5,697,087 A | 12/1997 | Miya et al. | |
| 5,732,334 A | 3/1998 | Miyake | |
| 5,825,227 A | 10/1998 | Kohama et al. | |
| 5,880,635 A | 3/1999 | Satoh | |
| 5,969,560 A | 10/1999 | Kohama et al. | |
| 6,025,651 A | 2/2000 | Nam | |
| 6,075,995 A | 6/2000 | Jensen | |
| 6,118,985 A | 9/2000 | Kawakyu et al. | |
| 6,148,220 A | 11/2000 | Sharp et al. | |
| 6,151,509 A | 11/2000 | Chorey | |
| 6,175,279 B1 | 1/2001 | Ciccarelli et al. | |
| 6,183,703 B1 | 2/2001 | Hsu et al. | |

(Continued)

FOREIGN PATENT DOCUMENTS

JP    2001053502    2/2001

(Continued)

OTHER PUBLICATIONS

U.S. Appl. No. 10/385,059.

(Continued)

*Primary Examiner*—Thanh V Pham
(74) *Attorney, Agent, or Firm*—Xin Wen

(57) ABSTRACT

Systems and methods are disclosed for a device having one or more power amplifier and/or LNA circuits positioned on the amplifier module.

20 Claims, 3 Drawing Sheets

U.S. PATENT DOCUMENTS

| | | |
|---|---|---|
| 6,198,351 B1 | 3/2001 | Winslow |
| 6,203,587 B1 | 3/2001 | Lesieur et al. |
| 6,262,630 B1 | 7/2001 | Eriksson |
| 6,265,943 B1 | 7/2001 | Dening et al. |
| 6,265,954 B1 | 7/2001 | Krause |
| 6,281,755 B1 | 8/2001 | Feld et al. |
| 6,281,762 B1 | 8/2001 | Nakao et al. |
| 6,294,967 B1 | 9/2001 | Hirai et al. |
| 6,326,866 B1 | 12/2001 | Sasaki et al. |
| 6,366,788 B1 | 4/2002 | Fujioka et al. |
| 6,417,730 B1 | 7/2002 | Segallis et al. |
| 6,462,622 B1 | 10/2002 | Mori et al. |
| 6,483,398 B2 | 11/2002 | Nagamori et al. |
| 6,496,684 B2 | 12/2002 | Nakao et al. |
| 6,625,050 B2 | 9/2003 | Suwa et al. |
| 6,630,372 B2 | 10/2003 | Ball |
| 6,639,466 B2 | 10/2003 | Johnson |
| 6,677,833 B2 | 1/2004 | Sheen |
| 6,678,506 B1 | 1/2004 | Dolman et al. |
| 6,683,512 B2 | 1/2004 | Nakamata et al. |
| 6,693,498 B1 | 2/2004 | Sasabata et al. |
| 6,694,129 B2 | 2/2004 | Peterzell et al. |
| 6,696,903 B1 | 2/2004 | Kawahara et al. |
| 6,720,850 B2 | 4/2004 | Sasabata et al. |
| 6,762,659 B2 | 7/2004 | Son et al. |
| 6,774,718 B2 | 8/2004 | Ichitsubo et al. |
| 6,798,287 B2 | 9/2004 | Wu et al. |
| 6,803,818 B2 * | 10/2004 | van Amerom ............... 330/144 |
| 6,822,515 B2 | 11/2004 | Ichitsubo et al. |
| 6,847,262 B2 | 1/2005 | Ichitsubo et al. |
| 6,911,942 B2 | 6/2005 | Fukuda et al. |
| 6,914,482 B2 | 7/2005 | Ichitsubo et al. |
| 7,071,783 B2 | 7/2006 | Ichitsubo et al. |
| 2004/0203552 A1 | 10/2004 | Horiuchi et al. |
| 2004/0204037 A1 | 10/2004 | He et al. |
| 2005/0179498 A1 | 8/2005 | Tsutsui et al. |
| 2005/0239415 A1 | 10/2005 | Sagae et al. |
| 2006/0164188 A1 | 7/2006 | Li et al. |

FOREIGN PATENT DOCUMENTS

| | | |
|---|---|---|
| WO | WO2004049495 | 6/2004 |

OTHER PUBLICATIONS

U.S. Appl. No. 10/804,737.
U.S. Appl. No. 10/843,409.
U.S. Appl. No. 10/919,850.
U.S. Appl. No. 10/938,779.
U.S. Appl. No. 10/972,636.
U.S. Appl. No. 11/039,687.
U.S. Appl. No. 11/064,261.
U.S. Appl. No. 11/110,249.
U.S. Appl. No. 11/121,288.
U.S. Appl. No. 11/126,667.
U.S. Appl. No. 11/152,308.
U.S. Appl. No. 11/173,741.
U.S. Appl. No. 11/173,965.
U.S. Appl. No. 11/173,968.
U.S. Appl. No. 11/323,763.
U.S. Appl. No. 11/323,788.
U.S. Appl. No. 11/433,896.
U.S. Appl. No. 11/486,465.
U.S. Appl. No. 60/696,206.
U.S. Appl. No. 60/698,586.
Tie Wang et al., Assessment of Flip Chip Assembly and Reliability via Reflowable Underfill, 2001, IEEE, 2001 Electric Components and technology Conference.
Tie Wang et al., Assessment of Flip Chip Assembly and Reliability via Reflowable Undefill, 2001 IEEE, 2001 Electric Components and technology Conference.
Charles A. Harper, Electronic Packaging and Interconnection handbook, Technical Seminars, Inc. Lutherville, Maryland, Nov. 1, 2006.
Peter Van Zant. Microchip Fabrication, A Practical Guide to Semiconductor Processing, $4^{th}$ Ed., Apr. 3, 2000.

* cited by examiner

MODULE WITH MULTIPLE POWER AMPLIFIERS AND POWER SENSORS

This application is a continuation of Application Ser. No. 10/804,737, filed on Mar. 18, 2004, now abandoned the content of which is incorporated by reference.

BACKGROUND

This invention relates generally to a method and apparatus for fabricating an electronic module.

A typical integrated circuit (IC) or semiconductor die includes external connection points termed "bond pads" that are in electrical communication with integrated circuits formed in or on the active surface of the die. The bond pads are used to provide electrical connection between the integrated circuits and external devices, such as lead frames or printed circuit boards. The bond pads also provide sites for electrical testing of the die, typically by contact with probes, which send and receive signals to and from the die to evaluate the functionality of the die.

In a conventional die/lead frame assembly, the semiconductor die is attached to a die paddle of a lead frame using an adhesive or tape. The bond pads formed on the face of the die are typically electrically and mechanically attached to lead fingers terminating adjacent the periphery of the die using thin bonding wires of gold, aluminum or other metals or alloys. Other types of lead frames, such as so-called "leads over chip" (LOC) or "leads under chip" (LUC), dispense with the die paddle and support the die from portions of the lead fingers themselves.

Wire bonding is typically a process through which some or all of the bond pads formed on the face of the die are connected to the lead fingers or buses of a lead frame by thin bonding wires. The bonding wires comprise the electrical bridge between the bond pads and the leads of the packaged integrated circuit. A wire bonding apparatus bonds the bonding wires to the bond pads and to the lead fingers, typically using heat and pressure, as well as ultrasonic vibration in some instances. Following wire bonding, the lead frame and die are typically encapsulated in a plastic (particle-filled polymer) or packaged in a preformed ceramic or metal package. After encapsulation, the lead fingers are then trimmed and usually bent to form external leads of a completed semiconductor package in what is termed a "trim and form" operation.

Another wire bonding application may include chip-on-board (COB), where the back-side surface of a bare IC die is directly mounted on the surface of a substantially rigid printed circuit board (PCB) or other carrier substrate, and bond pads on the front-side or active surface of the bare die are then wire bonded to wire bondable trace pads or terminals on the surface of the PCB to interconnect circuitry in the die with external circuitry through conductive traces on the PCB. Likewise, wire bondable traces may be formed from a metal film carried on a flexible polyimide or other dielectric film or sheet similar to those employed in so-called TAB (tape automated bonding) lead frame structures. A die may be back-mounted on the flex circuit and the traces wire bonded to bond pads on the surface of the die.

A typical die bond pad is formed as a rectangle or square framed or bounded by a passivation layer on the face of the die. Bond pads are typically formed from a conductive metal such as aluminum and electrically connected to an underlying integrated circuit formed in or on the die. A passivation layer formed of a dielectric material (silicon dioxide, silicon nitride, polyimide, BPSG, etc.) or as a sandwich of different materials (e.g., silicon dioxide/silicon) covers the oxide layer, and the bond pad is embedded in the passivation layer. Such bond pads may be located generally along the peripheral edges of the die, inset from the edges a desired distance, or in one or more center rows. These bond pads are then typically wire bonded to a lead frame, thermocompression bonded to an overlying TAB tape or flip-chip bonded (with appropriate prior "bumping" of the bond pads) to a printed circuit board.

U.S. Pat. No. 6,630,372 discloses a semiconductor device, such as an integrated circuit die, that includes a plurality of bond pads on an active surface thereof electrically connected to internal circuitry of the semiconductor device, and a plurality of jumper pads on the active surface, which are electrically isolated from internal circuitry of the die. The jumper pads effectively provide connection for wire bonds to be made across the active surface between bond pads. The jumper pads may be formed directly on the semiconductor device or on a non-conductive support structure that is attached to the semiconductor device. The '372 patent notes that it is often desirable to interconnect various bond pads on a single semiconductor die in order to alter the input and/or output functionality of the die, such as when it is necessary to "wire around" defective portions of a die which is only partially functional. For example, a 16 megabit DRAM memory die may only demonstrate 11 megabits of functional memory under electrical testing and burn-in. Alternatively, it may be desirable for a die having a given input/output (bond pad) configuration to "look" to a particular lead frame or carrier substrate as if it were configured differently so that the die could be used with a lead frame for which it was not originally intended.

The device of the '372 patent shows embodiments of radio frequency (RF) circuits used in wireless communications. The RF circuit typically consists of transistors, diodes, and a large network of passive components such as inductors (L), capacitors (C) and resistors (R). Due to the physics of inductor and capacitor, these networks of passive components often takes up large die area. To reduce the die cost, RF module are commonly made of IC and discrete passive elements which are SMD mounted on a multi-layer printed circuit board (PCB) substrate or embedded in a ceramic structure such as low-temperature co-fired ceramics (LTCC) substrate. However, modules made with discrete components are generally bulky limiting the ability to reduce module size. Further, imprecise control of substrate material property, dimension, or circuit layout often results in low RF performance.

SUMMARY

Systems and methods are disclosed for a device having an active substrate comprising substantially transistors or diodes formed thereon; a passive substrate comprising substantially inductors, capacitors or resistors formed thereon; a plurality of bonding pads positioned on the active and passive substrates; and bonding wires connected to the bonding pads.

Implementations of the device may include one or more of the following. Power amplifier(s) and/or LNAs can be positioned on the module. The module can be made of one or more active substrates for active and certain supporting passive components. The module can include one or more substantially passive substrates for passive components only. The substrates are interconnected with bonding wires. The substrates can be mounted on a metal lead-frame, and can be encapsulated in molded plastics. The active substrate contains primarily for transistors, which could be either Silicon Biploar, CMOS, RFCMOS, BICOMS, SiGe, GaAs HBT, HEMT, etc. They are typically made from more expensive wafers with the semiconductor layer structure, with active devices, junctions, and dopings. The passive substrate is for circuits network of R, L, C which do not need active device structure. A few conductive metal layers can be used on the passive substrate for inductor (L) and interconnection. An insulating layer with suitable dielectric properties such as Nitride or Oxide can be used as the dielectric layer for capacitor (C). The passive substrate can include a layer such as TaN and NiCr for resistor (R). Passive components can still be on the die of the active IC, but the bulky elements of circuit of passive components such as transmission lines, impedance matching network, filters, balun, or diplexers are located in the inexpensive dies of passive substrate.

Advantages of the module can include one or more of the following. The passive substrates are manufactured on semi-insulating GaAs or insulator wafer without the active transistor structure layer, which reduce wafer cost and processing time. Passive components on the passive substrates are made with precision semiconductor process with high quality control of component values. Comparing with PCB, the higher dielectric constant of GaAs results in smaller size for same RF circuit. The metal lead frame provides better heat dissipation for power devices. RF modules can be made with metal lead frame, thus eliminating PCB/LTCC substrate and SMD steps. The metal lead frame also allows higher temperature in subsequent manufacturing steps.

BRIEF DESCRIPTION OF THE DRAWINGS

In order that the manner in which the above recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

The accompanying drawings, which are incorporated in and form a part of this specification, illustrate embodiments of the invention and, together with the description, serve to explain the principles of the invention.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
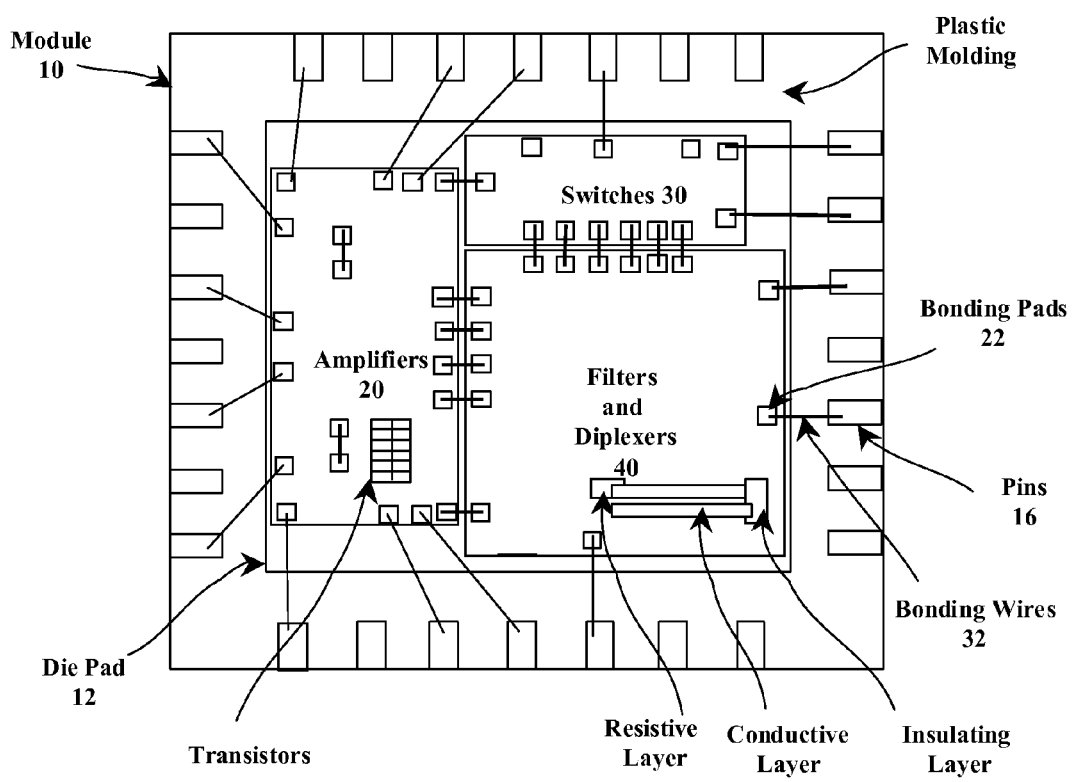
FIG. 1 is a system diagram of a module having active and passive substrates on the die pad.

FIG. 1 shows an exemplary semiconductor device 10. The device 10 can be any suitable communications circuit. The device 10 of FIG. 1 is manufactured to deliver excellent RF, analog, and digital performance and reliability at a competitive cost. This is achieved by separating the circuit into one or more active substrates that are electrically connected to one or more passive substrates, all of which are positioned on a die pad for subsequent soldering onto a communications printed circuit board.

As illustrated in FIG. 1, the module 10 is a device, which includes a die pad 12 of generally rectangular configuration. The module has a surface carrying a plurality of conductive pads called pins 16 proximate its perimeter. The pins 16 and the die pad 12 are packaged as an integral part of the module 10, making contact with and providing an external contact for internal circuitry (not shown) contained within the module 10. The pins 16 and the die pad 12 can be encapsulated in insulating material such as plastics or ceramics to become an integral part as is known in the art. The die pad 12 can be used as a ground, providing direct thermal path for heat removal from the module.

The pins 16 are preferably formed from a conductive material such as a metal, metal alloy, or any other suitable material known in the art to which a wire bond can be attached. The pins 16 may be mechanically stamped, chemically etched, silk-screened, printed, sprayed through a patterned mesh, electrochemically deposited, or electroplated, electroless-plated or otherwise formed to the preferred pattern.

The integrated circuit dies, which are fabricated on semiconductor substrates, are mounted on the die pad 12. A first active substrate 20, a second active substrate 30 and a first passive substrate 40 are mounted on the die pad 12. In one embodiment, the active substrate 20 can include power amplifiers and low noise amplifiers, while the second active substrate 30 can include switches thereon. The first passive substrate 40 includes passive components such as capacitors, inductors or resistors that form filters and diplexers, among others. Each substrate 20, 30 or 40 contains a number of bonding pads 22 that are electrically connected (wire-bonded) to other bonding pads 22 on the substrates 20, 30 or 40 or to pins 16 on the die perimeter. Moreover, each substrate 20, 30 and 40 may have intra-substrate pads that allow wire-bonding to be done within a substrate.

The first and second active substrates 20 and 30 can be combined into one active substrate, or alternatively, can be split into a number of active substrates. Further, passive devices can be used in the active substrates 20 and 30. However, due to cost and performance reasons, it is preferred that the active substrates 20 and 30 contain mainly active devices such as diodes and transistors that form the PAs and the LNAs. Similarly, due to cost reasons, the passive substrate 40 contains mostly passive devices such as capacitors, inductors and resistors even though on occasions, the passive substrate 40 can contain a few diodes and transistors that do not need the precision and performance of devices fabricated on the active substrates 20 and 30. In one embodiment, the substrates can be fabricated using gallium arsenide (GaAs) and in particular the active substrates can be processed to form heterojunction bipolar transistors (HBT) thereon. Other semiconductor materials may also be used.

The substrates 20, 30 and 40 may be preformed, and each adhesively attached to the die surface with an adhesive such as an epoxy or other similar material known in the art.

The semiconductor dies 20, 30, and 40 can be mounted to a conventional lead frame as is known in the art. Alternatively, the lead frame can include a plurality of lead fingers extending outwardly from proximate the perimeter of the module 10 and a die paddle which supports the die 10 relative to the lead fingers. The lead fingers form leads for a packaged semiconductor device after transfer-molded polymer encapsulation of the dies 20, 30 and 40 and lead frame as is known in the art.

Wire bonds 32 can then be formed: between bonding pads 22 and pins 16; between inter-chip bond pads, between adjacent or proximate bond pads; between bond pad and intra-chip pad. The termination points of wire bonds 32 can be of ball, wedge, or other configuration as is known in the art, and formed with a conventional wire bonding machine. Accordingly, a large number of I/O alternative configurations can be achieved for any semiconductor device, depending on the number and layout of the pads and configuration of wire bonds.

In one embodiment, the active substrates 20 and 30 are gallium arsenide substrates. The fabrication of gallium arsenide structures may begin by applying an organic photoresist layer on the upper surface of a gallium arsenide substrate and patterning it in an appropriate manner to form, for example, a field effect transistor (FET) active layer mask. The next step is to ion implant impurities through the photoresist mask where there are windows or openings to form a doped region extending from the surface of the gallium arsenide substrate to a predetermined depth. The photoresist layer is subsequently removed and a capping layer is deposited over the gallium arsenide substrate.

The material of a capping layer may, for example, be silicon nitride, silicon oxide, phosphorus-doped silicon oxide or aluminum nitride. The purpose of the capping layer is to reduce the outgassing of arsenic from the gallium arsenide substrate when the ion implanted region is annealed. The ion-implanted region is annealed by raising the gallium arsenide substrate to a high temperature such as 800 degrees C. to permit recrystallization of the gallium arsenide damaged by the ion implantation. During recrystallization, substitution of the ion-implanted ions into the crystal lattices of the gallium arsenide material occurs. After the ion-implanted region is annealed, a step also called activation, the capping layer is removed and further processing continues. This includes the formation of ohmic contacts defining drain and source and deposition of material suitable to form the gate of a field effect transistor. The protective capping layer is applied subsequent to the step of ion implantation. After the step of annealing, the capping layer is removed by selective chemical etching. The fabrication of the active structures such as transistors and diodes on the active substrates therefore involve many steps.

In the case of GaAs HBT, complicated 3D structures of emitters, bases and collectors must be formed. The processing requires many steps of mask and photoresist for etching and lift-off of layers. Similarly, many steps of masks and layers for CMOS, BICMOS, and SiGe semiconductor dies are known to those skilled in the art.

In contrast, the passive substrate 40 involves relatively simple geometries that define the RLC properties of the respective component being defined. Hence, the fabrication of the passive structures such as resistors, inductors and capacitors on the active substrate 40 involve fewer steps than those for the active substrates 20 and 30. Hence, the structure of active substrates 20 and 30 are more complicated and expensive than the passive substrates 40 to fabricate. By separating the manufacturing of passive substrates from the active substrates, over-all yield is improved, thus also reducing cost. Moreover, because the passive components are formed using semiconductor manufacturing techniques on gallium arsenide substrates, the electrical property and dimensions of each passive component can be tightly controlled, thus yielding better performance than modules with typical off-chip passive components.

Figure 2:
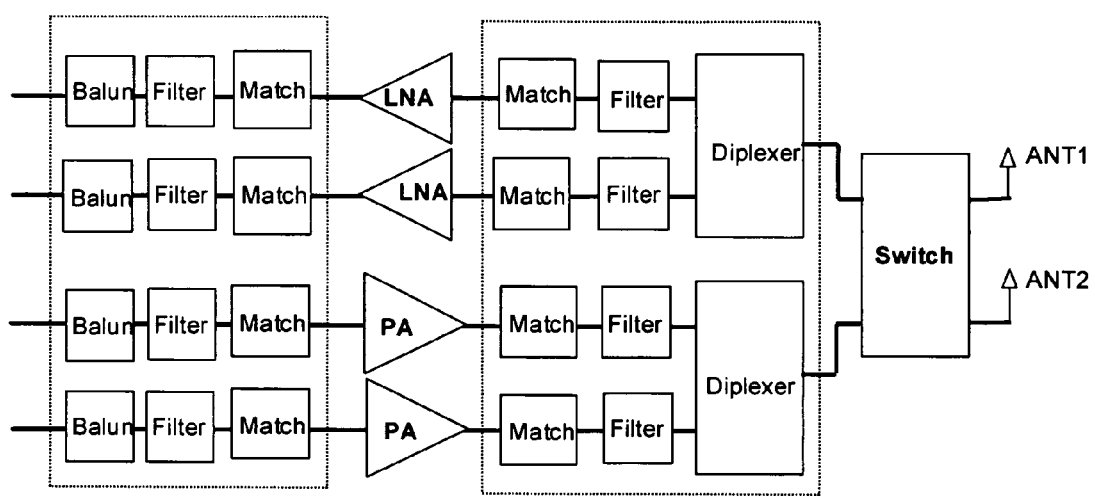
FIG. 2 is the electrical schematics for a wireless module in accordance to an embodiment of the present invention.

FIG. 2 shows an exemplary circuit that is partitionable into circuits on an active and a passive substrate. In this embodiment is a dual band front-end module (FEM) for communications circuitry such as high performance 802.11 a/b/g wireless LAN circuits. The module can be a unitary device for wireless communications, and can include integrated power amplifiers (PAs), low noise amplifiers (LNAs), switches and other circuitry and auxiliary electronic components, for example. In one embodiment, the module integrates dual band power amplifiers, dual band low noise amplifiers, switch, diplexer, baluns, filters, impedance matching networks, bias control, and power sensors to simplify design and production of end products. Bias control and compensation circuitry ensures stable performance over wide operating temperature range.

The circuit of FIG. 2 includes a plurality of filters whose outputs are fed to impedance matching circuits. The baluns, filters and matching circuits are substantially passive circuits, so these circuits can be placed on the passive substrate 40 of FIG. 1. Since the PA and LNA circuits are primarily active, these circuits belong on the active substrate 20. The input to the LNA and the output from the PA are provided to additional sets of match circuits, filters and diplexer, which are again formed on the passive substrate 40 since matching circuits, filters and diplexer uses primarily RLC components. The outputs of the diplexers are provided to a switch, which in turn is connected to antennas. Since the switch uses transistors, it belongs on an active substrate. In the embodiment of FIG. 1, the switch is fabricated on a separate active substrate 30 due to space constraints on the active substrate 20.

Figure 3:
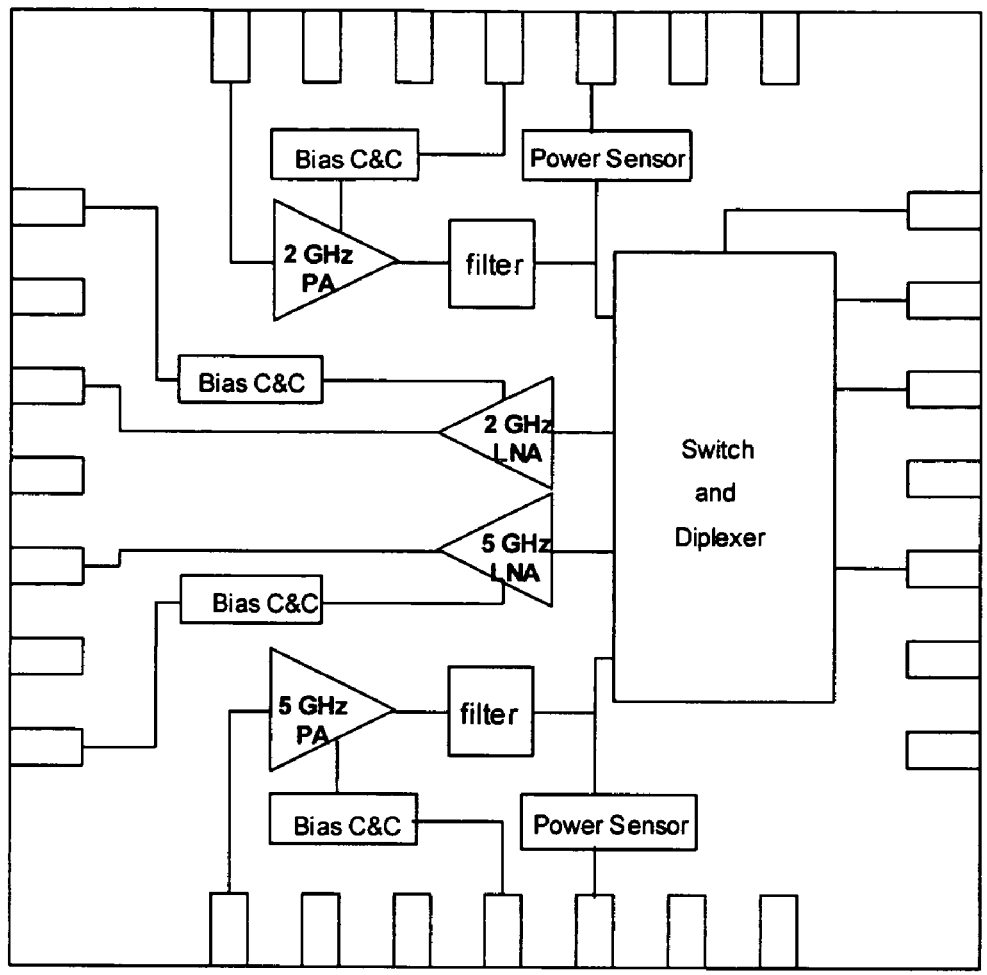
FIG. 3 illustrates an exemplary IC pin-out.

FIG. 3 illustrates an exemplary pin-out diagram of an exemplary IC for the circuit of FIG. 2. The pin-out shows the bottom side of the IC that includes a multitude of metal electrodes and an insulating substrate. The IC can include a center ground, which is the exposed bottom side of die pad, serving as major path for dissipating heat generated by the active substrate. To keep the amplifiers running without excessive temperature, it is important to minimize the heat transfer resistance of the active substrate to external space on printed circuit. It is also desirable to have minimal electrical resistance for the current flowing between the center ground and the ground of the circuit board of the wireless device.

In the typical application for a wireless communication device, the IC of FIG. 3 is electrically mounted to a printed circuit board in the wireless communication device. The circuit board includes a grounding circuit design at the location where the IC is mounted.

Those skilled in the art will appreciate that semiconductor devices according to the present invention may include an integrated radio frequency (RF) transceiver circuit. An electronic system includes an input device and an output device coupled to a processor device which, in turn, is coupled to an RF circuit incorporating the exemplary integrated circuit module 10 of FIG. 1.

The module 10 can also be employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. In addition, it will be understood that the shape, size, and configuration of bond pads, jumper pads, dice, and lead frames may be varied without departing from the scope of the invention and appended claims. For example, the jumper pads may be round, oblong, hemispherical or variously shaped and sized so long as the jumper pads provide enough surface area to accept attachment of one or more wire bonds thereto. In addition, the bond pads may be positioned at any location on the active surface of the die.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. Accordingly, the claims appended hereto are written to encompass all semiconductor devices including those mentioned. Those skilled in the art will also appreciate that various combinations and obvious modifications of the preferred embodiments may be made without departing from the spirit of this invention and the scope of the accompanying claims.

The invention claimed is:

1. A radio frequency (RF) amplifier module, comprising:
   a module substrate;
   a first active substrate mounted on the module substrate, the first active substrate comprising:
     a first transmitting amplifier configured to produce a first amplified RF signal in response to a first transmitting RF signal in a first frequency band;
     a second transmitting amplifier configured to produce a second amplified RF signal in response to a second transmitting RF signal in a second frequency band;
     a first reception amplifier configured to produce a third amplified RF signal in response to a first reception RF signal in the first frequency band; and
     a second reception amplifier configured to produce a fourth amplified RF signal in response to a second reception RF signal in the second frequency band; and
   a passive substrate mounted on the module substrate and in electronic connection with the first active substrate, the passive substrate comprising:
     a first diplexer configured to receive the first amplified RF signal from the first transmitting amplifier and the second amplified RF signal from the second transmitting amplifier, wherein the first diplexer is configured to send the first amplified RF signal and the second amplified RF signal to a first antenna; and
     a second diplexer configured to receive the first reception RF signal and the second reception RF signal from a second antenna, wherein the second diplexer is configured to send the first reception RF signal to the first reception amplifier and to send the second reception RF signal to the second reception amplifier.

2. The RF amplifier module of claim 1, wherein the passive substrate further comprises:
   a first impedance matching circuit configured to receive the first amplified RF signal from the first transmitting amplifier and send the first amplified RF signal to the first diplexer;
   a second impedance matching circuit configured to receive the second amplified RF signal from the second transmitting amplifier and send the second amplified RF signal to the first diplexer;
   a third impedance matching circuit configured to receive the first reception RF signal from the second diplexer and to send the first reception RF signal to the first reception amplifier; and
   a fourth impedance matching circuit configured to receive the second reception RF signal from the second diplexer and to send the second reception RF signal to the second reception amplifier.

3. The RF amplifier module of claim 1, wherein the passive substrate further comprises filters configured to filter the first amplified RF signal and the second amplified RF signal before the first amplified RF signal and the second amplified RF signal are received by the first diplexer.

4. The RF amplifier module of claim 1, wherein the passive substrate further comprises filters configured to filter the first reception RF signal and the second reception RF signal from the second diplexer before the first reception RF signal and the second reception RF signal are received by the first reception amplifier and the second reception amplifier.

5. The RF amplifier module of claim 1, wherein the passive substrate further comprises a first RF sensing circuit configured to sense the first amplified RF signal from the first transmitting amplifier and to output a first RF sensing signal, wherein the passive substrate further comprises a second RF sensing circuit configured to sense the second amplified RF signal from the second transmitting amplifier and to output a second RF sensing signal.

6. The RF amplifier module of claim 1, wherein the module substrate comprises a conductive die pad, wherein the first active substrate and the passive substrate are both mounted on the conductive die pad.

7. The RF amplifier module of claim 1, further comprising a second active substrate mounted on the module substrate and in electronic connection with the first active substrate and the passive substrate, the second active substrate comprising:
   a switch configured to direct the first amplified RF signal and the second amplified RF signal from the first diplexer to the first antenna, or to direct the first reception RF signal and the second reception RF signal from the second antenna to the second diplexer.

8. The RF amplifier module of claim 7, wherein the module substrate comprises a conductive die pad, wherein the first active substrate, the second active substrate, and the passive substrate are mounted on the same conductive die pad.

9. The RF amplifier module of claim 1, wherein the first active substrate comprises a plurality of bonding pads configured to be connected with the passive substrate by impedance matching bonding wires.

10. The RF amplifier module of claim 9, wherein the module substrate comprises a plurality of terminals configured to be connected to the plurality of bonding pads on the first active substrate, wherein at least some of the plurality of terminals are configured to communicate with the first antenna and the second antenna.

11. The RF amplifier module of claim 1, wherein the first active substrate comprises a plurality of bonding pads configured to be connected within the first active substrate by impedance matching bonding wires.

12. The RF amplifier module of claim 1, wherein the passive substrate comprises an insulating layer.

13. The RF amplifier module of claim 1, wherein the first active substrate comprises one or more conductive layers.

14. The RF amplifier module of claim 1, further comprising an encapsulation material configured to encapsulate the first active substrate and the passive substrate on the module substrate.

15. A radio frequency (RF) amplifier module, comprising:
   a module substrate comprising a conductive die pad;
   a first active substrate mounted on the module substrate, the first active substrate comprising:

a transmitting amplifier configured to produce a first amplified RF signal in response to a transmitting RF signal; and a reception amplifier configured to produce a second amplified RF signal in response to a reception RF signal; and a passive substrate mounted on the module substrate and in electronic connection with the first active substrate, the passive substrate comprising:

a first filter configured to filter the first amplified RF signal from the transmitting amplifier before the first amplified RF signal is sent to an antenna;

a second filter configured to filter the transmitting RF signal before the transmitting RF signal is received by the transmitting amplifier; and a third filter configured to filter the second amplified RF signal from the reception amplifier, wherein both the first active substrate and the passive substrate are mounted on the conductive die pad.

16. The RF amplifier module of claim 15, wherein the first active substrate and the passive substrate each comprises a plurality of bonding pads configured to be connected by impedance matching wire bonding between the first active substrate and the passive substrate, and within the first active substrate.

17. The RF amplifier module of claim 15, further comprising a RF sensing circuit configured to sense the first amplified RF signal from the transmitting amplifier and to output a RF sensing signal.

18. The RF amplifier module of claim 15, further comprising a second active substrate mounted on the module substrate and in connection with the first active substrate and the passive substrate, the second active substrate comprising:

a switch configured to direct the first amplified RF signal from the first filter to the first antenna, or to direct the first reception RF signal from the second antenna to the third filter.

19. A radio frequency (RF) amplifier module, comprising:

a module substrate comprising a conductive die pad;

an active substrate mounted on the module substrate, the active substrate comprising:

a transmitting amplifier configured to produce an amplified RF signal in response to a transmitting RF signal; and a passive substrate comprising:

a first impedance matching circuit;

a first filter coupled to the first impedance matching circuit, wherein the first impedance matching circuit and the first filter are configured to provide impedance matching and to filter the amplified RF signal from the transmitting amplifier before the amplified RF signal is received by an antenna;

a second filter; and a second impedance matching circuit coupled to the second filter, wherein the second impedance matching circuit and the second filter are configured to provide impedance matching and to filter the transmitting RF signal before the transmitting RF signal is received by the transmitting amplifier, wherein both the first active substrate and the passive substrate are mounted on the conductive die pad, wherein the active substrate and the passive substrate each comprises a plurality of bonding pads configured to be connected by impedance matching bonding wires between the active substrate and the passive substrate, and within the active substrate.

20. The RF amplifier module of claim 19, further comprising a RF sensing circuit configured to sense the amplified RF signal from the transmitting amplifier and to output a RF sensing signal.

* * * * *